United States Patent [19]

Laing et al.

[11] Patent Number: 5,399,975

[45] Date of Patent: Mar. 21, 1995

[54] METHOD OF TESTING CONTINUITY OF A CONNECTION BETWEEN AN INTEGRATED CIRCUIT AND A PRINTED CIRCUIT BOARD BY CURRENT PROBING INTEGRATED CIRCUIT

[75] Inventors: Mark A. Laing, Hemel Hempstead; Robert J. Williams, Harpenden, both of England

[73] Assignee: Marconi Instruments Limited, United Kingdom

[21] Appl. No.: 71,576

[22] Filed: Jun. 1, 1993

[30] Foreign Application Priority Data

Jun. 15, 1992 [GB] United Kingdom ............... 9212646

[51] Int. Cl.6 ........................................... G01R 31/02
[52] U.S. Cl. .................................... 324/537; 324/527; 324/750; 324/754
[58] Field of Search ............... 324/527, 529, 537, 538, 324/158 F, 158 P, 158 R, 149, 72.5

[56] References Cited

U.S. PATENT DOCUMENTS

| | | | |
|---|---|---|---|
| 3,992,663 | 11/1976 | Seddick | 324/529 |
| 4,186,338 | 1/1980 | Fichtenbaum | 324/529 X |
| 4,220,917 | 9/1980 | McMahon, Jr. | 324/537 X |
| 4,727,317 | 2/1988 | Oliver | 324/158 R |
| 4,779,043 | 10/1988 | Williamson, Jr. | 324/158 R |
| 4,963,824 | 10/1990 | Hsieh et al. | 324/158 F X |
| 5,059,897 | 10/1991 | Aton et al. | 324/158 R |

FOREIGN PATENT DOCUMENTS

| | | |
|---|---|---|
| 1725976 | 5/1979 | Australia . |
| 0177210 | 4/1984 | European Pat. Off. . |
| 0306656 | 3/1989 | European Pat. Off. . |
| 3729500 | 3/1989 | Germany . |

Primary Examiner—Kenneth A. Wieder
Assistant Examiner—Glenn W. Brown
Attorney, Agent, or Firm—Kirschstein, Ottinger, Israel & Schiffmiller

[57] ABSTRACT

A method of testing the electrical conductivity of a connection between an integrated circuit device (9) and a circuit board (7) to which the device (9) is connected. The device (9) includes a current path between a further connection (13) thereto and the connection (15) to be tested. The method comprises the steps of, while the circuit is inoperative: applying via the board (8) a potential of a first amount to the further connection (13); applying via the board (7) a potential of a second different amount to the connection (15) being tested; and positioning a probe adjacent the device (9) to sense indirectly current in the current path, the presence of current indicating that the connection (15) being tested is conductive.

14 Claims, 5 Drawing Sheets

METHOD OF TESTING CONTINUITY OF A CONNECTION BETWEEN AN INTEGRATED CIRCUIT AND A PRINTED CIRCUIT BOARD BY CURRENT PROBING INTEGRATED CIRCUIT

BACKGROUND OF THE INVENTION

1. Field of the Invention

This invention relates to a method of testing the electrical conductivity of a connection between an integrated circuit device and a circuit board to which the device is connected.

2. Description of the Related Art

A known method of testing such a connection comprises the application of potentials to circuit nodes of the circuit board and the monitoring of the responses of the circuit to these potentials. The potentials are generated by an automatic test equipment (ATE) central control system and applied to the circuit nodes by an in-circuit test (ICT) fixture of the equipment which supports the circuit board. The fixture comprises a so called bed of nails which contact the circuit nodes. The responses of the circuit picked-up by the bed of nails are passed to the central control system. The control system has full knowledge of the circuit board and the devices connected thereto and therefore knows what responses to expect to various patterns of potentials it generates. The control system is thus able to detect any bad connections between the devices and the board.

A disadvantage with this method is that it requires a detailed knowledge of the board and the devices connected thereto. The relevant information may not be available. Another disadvantage with this method is the lengthy time it takes to write the test program run by the central control system, which program defines the various patterns of potentials to be applied and the responses to be expected thereto.

Another known method uses the ATE system and ICT fixture mentioned above to test for the presence of a diode of the device under test connected between the pin under test and a ground supply pin of the device. The diode is part of voltage protection circuitry of the device provided for the pin under test. A voltage is applied to the pin under test to forward bias the diode, and the voltage between the pin under test and ground, i.e. the voltage dropped across the diode, is measured by the ATE system. If the characteristic forward voltage drop is measured the pin connection under test is good.

A disadvantage with this method is seen in the case where a pin of another device, similarly protected by means of a diode as the diode of the device under test, is on the same circuit node as the pin under test. If the connection of the pin under test is bad but the connection of the pin of the other device is good, the characteristic forward voltage drop will still be measured, and therefore the bad connection of the pin under test not detected.

SUMMARY OF THE INVENTION

According to the present invention there is provided a method of testing the electrical conductivity of a connection between an integrated circuit device and a circuit board to which the device is connected, said device including a current path between a further connection thereto and the connection to be tested, said method comprising the steps of, whilst the circuit is inoperative: applying via said board a potential of a first amount to said further connection; applying via said board a potential of a second different amount to the connection being tested; and utilising probe means positioned adjacent said device to sense indirectly current in said current path, the presence of current indicating that the connection being tested is conductive.

BRIEF DESCRIPTION OF THE DRAWINGS

A method of testing the electrical conductivity of a connection between an integrated circuit device and a circuit board to which the device is connected in accordance with the present invention will now be described, by way of example, with reference to the accompanying drawings, in which.

DETAILED DESCRIPTION OF THE PREFERRED EMBODIMENTS

Figure 1:
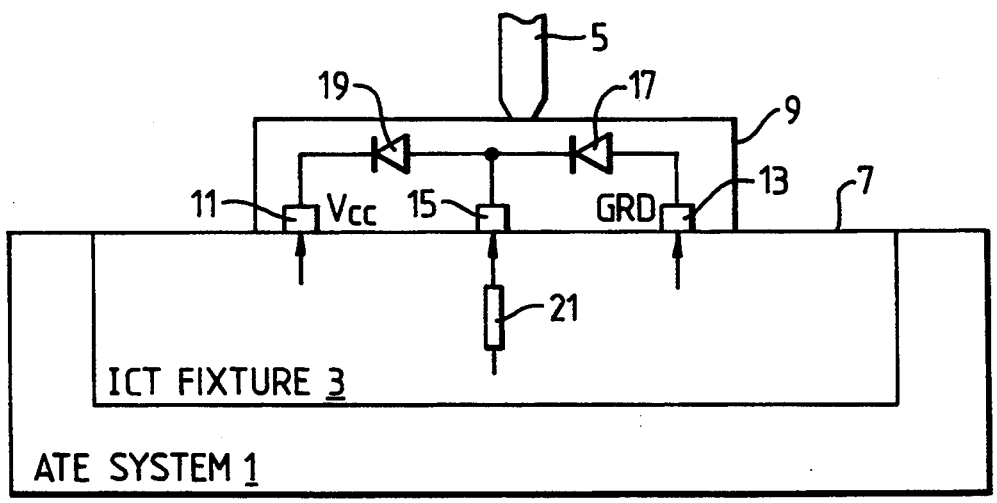
FIG. 1 is a schematic illustration of an equipment for carrying out the method, a circuit board connected thereto, and a CMOS device connected to the board.

Referring to FIG. 1, the equipment comprises an ATE central control system 1, an ICT fixture 3, a plurality of inductive probes 5 only one of which is shown in FIG. 1, and a frame structure for holding the probes in position (not shown in FIG. 1). A circuit board 7 is supported by and connected to fixture 3. A CMOS device 9 is connected to board 7. Device 9 includes $V_{cc}$ 11 and ground 13 supply pin connections and signal pin connection 15. Signal pin 15 is protected by CMOS device signal pin voltage protection circuitry comprising lower 17 and upper 19 clamp diodes. Fixture 3 includes a resistor 21.

Control system 1 generates potentials for application to circuit nodes of board 7. The potentials are applied by fixture 3 which comprises a so called bed of nails which contact the circuit nodes.

Use of the equipment to test the electrical conductivity of signal pin connection 15 to board 7 will now be described.

Figure 6:
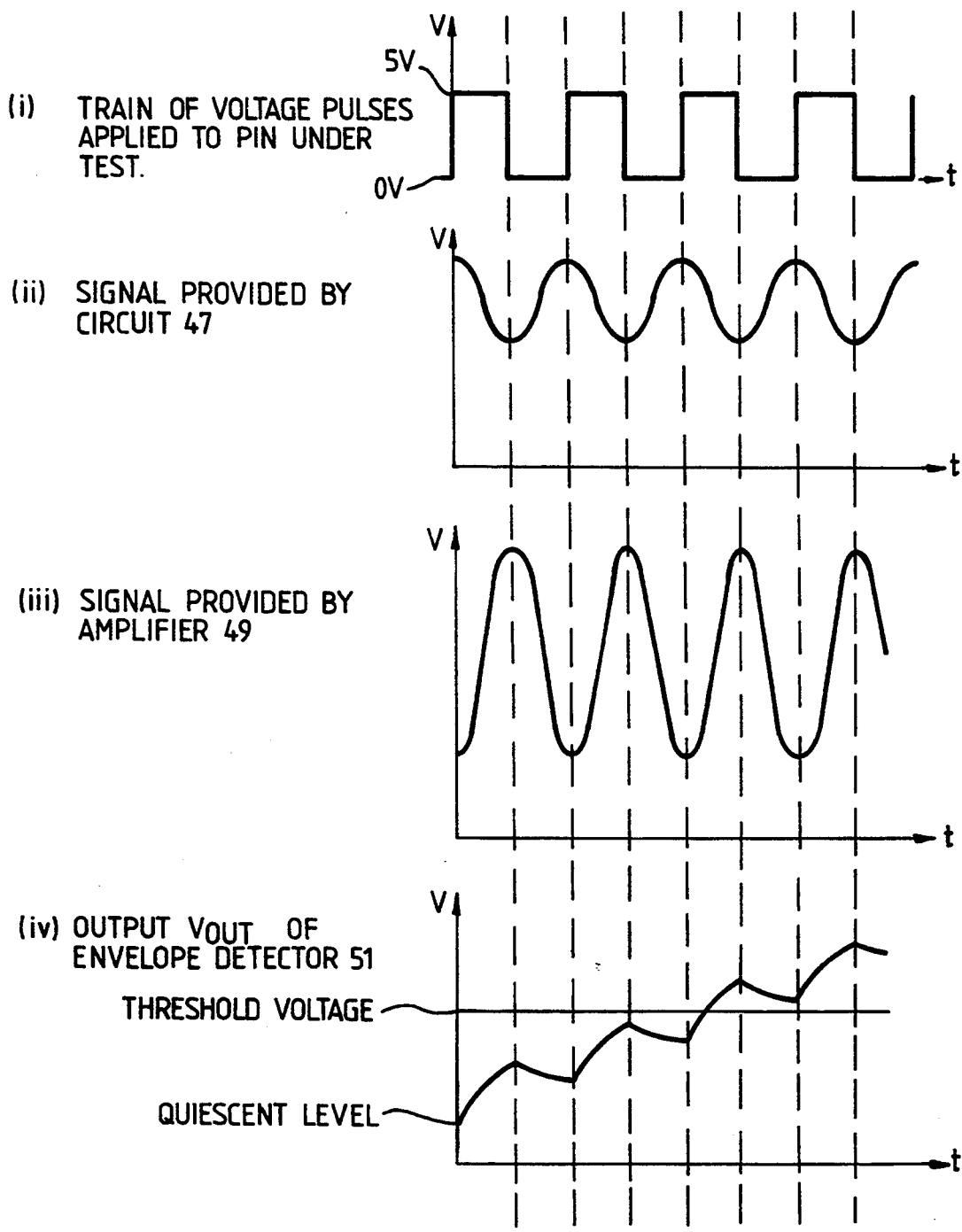
FIG. 6 illustrates various voltage waveforms present in use of the equipment.

The grounds of board 7 and ATE system 1 are not connected, i.e. board 7 is not powered up by system 1, in effect therefore board 7 floats. Potentials of approximately 5 V are applied to $V_{cc}$ pin 11 and ground pin 13. A train of voltage pulses, as shown in FIG. 6 at (i), of known frequency is applied via resistor 21 to pin under test 15. The potential varies between 5V and 0 V.

When the potential applied to pin 15 is 5 V no current flows in device 9. Assuming pin connection 15 is good, when the potential applied is 0 V lower clamp diode 17 is forward biassed, upper clamp diode 19 reverse biassed. Thus, current will flow in the path between pins 13 and 15 via diode 17. It is to be noted that it is assumed here that ground pin connection 13 is good. Resistor 21 serves to limit the flow of current. If pin connection 15 is not good no current will flow in device 9.

Figure 2:
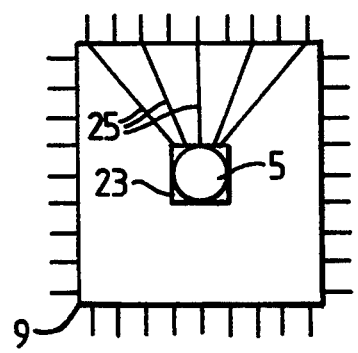
FIG. 2 shows the position of a probe of the equipment relative to the CMOS device of FIG. 1.

Inductive probe 5 shown in FIG. 1, positioned over device 9 picks up any current flow in device 9 and thereby provides an indication of whether or not pin connection 15 is good. As shown in FIG. 2 the probe 5 is positioned over the internal silicon wafer 23 of CMOS device 9 to sense current flow in device 9. FIG. 2 also shows the internal bond wires 25 and pin connections of device 9, of which pin connections pins 11, 13 and 15 of FIG. 1 are three.

Figure 3:
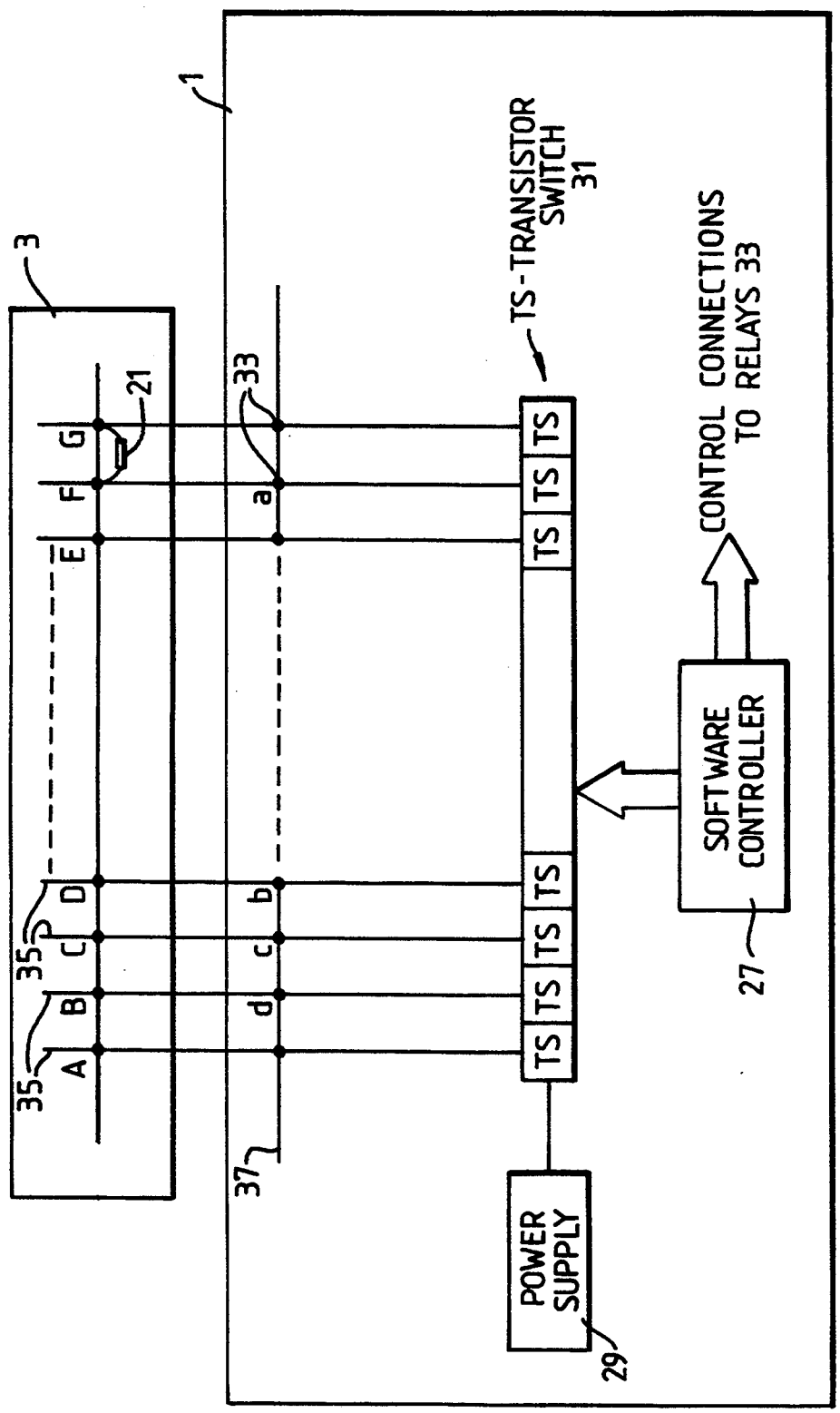
FIG. 3 is a schematic diagram showing in greater detail than it is shown in FIG. 1 a part of the equipment of FIG. 1.

Referring also to FIG. 3, ATE system 1 comprises a software controller 27, a power supply 29, transistor switches 31 capable of supplying 5 V or 0 V, and a matrix of relays 33. As mentioned previously, ICT fixture 3 comprises a bed of nails 35 which contact circuit nodes of circuit board 7 (not shown in FIG. 3), and resistor 21 (see also FIG. 1). Resistor 21 is connected between nails F and G which are not in use, i.e. do not contact circuit nodes of board 7.

The operation of the part of the equipment shown in FIG. 3 to apply the train of voltage pulses to pin connection 15 (see FIG. 1) via resistor 21 will now be described.

Assume nail D contacts the relevant circuit node for pin 15 of device 9. Relays a and b are closed by controller 27 connecting resistor 21 via pole 37 to nail D. The application of the train of voltage pulses to nail D is achieved by controller 27 repeatedly turning the transistor switch 31 allocated to nail G on and off to provide a voltage alternating between 5 V and 0 V. Applying the train of voltage pulses to another nail for the purpose of testing another pin of device 9 or the pin of another device on circuit board 7 is simply achieved by opening relay b and closing the relay on pole 37 under the nail to which the pulses are to be applied. Thus, the application of the train of pulses to another pin is achieved by opening the relay on pole 37 under the present pin and closing the relay on pole 37 under the next pin. For example, to transfer the train from nail D to nail C relay b is opened and relay c is closed, from nail C to nail B relay c is opened and relay d is closed.

Figure 4:
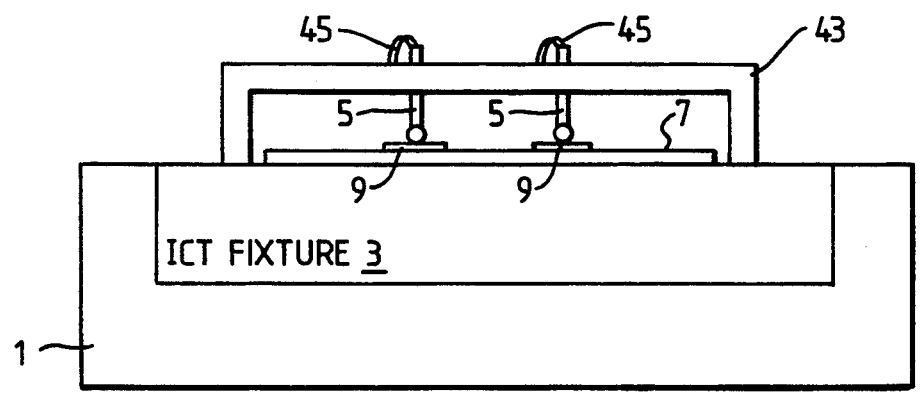
FIG. 4 is a further illustration of the equipment showing in particular probes thereof and a frame structure for holding the probes in position.

Referring also to FIG. 4, shown therein is the aforementioned frame structure 43 which holds each of the plurality of probes 5 in position over its respective device 9 for the testing of the pin connections to circuit board 7 of the device 9. Structure 43 is secured to ICT fixture 3. Probes 5 are connected by wires 45 to unused nails of fixture 3. By means of relays (not shown in FIG. 3) provided in respect of these unused nails system 1 selects the appropriate probe 5. System 1 then samples the voltage provided thereby, for more detail on this see below.

Figure 5:
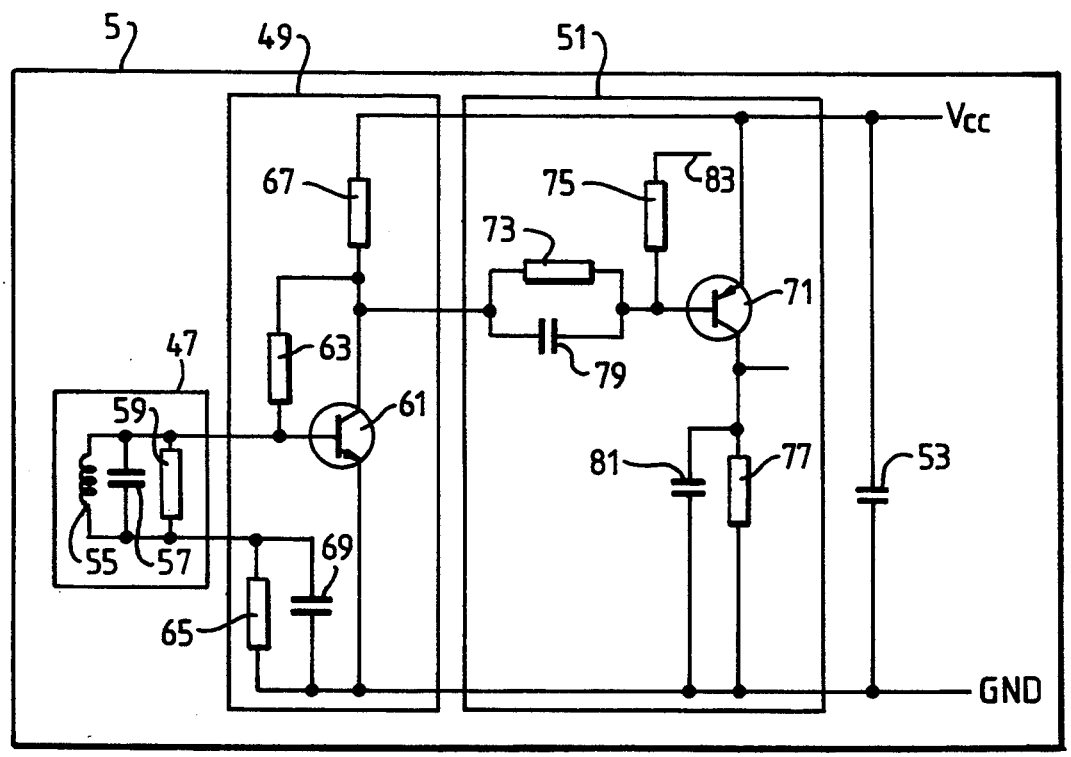
FIG. 5 is a circuit diagram of the circuitry of each of the probes of the equipment.

Referring also to FIGS. 5 and 6, the circuitry of each probe 5 comprises a damped tuned circuit 47, an amplifier 49, an envelope detector 51, and a supply decoupling capacitor 53. Tuned circuit 47 comprises an inductor 55, a capacitor 57 and a resistor 59. Amplifier 49 comprises a transistor 61, resistors 63, 65, 67 and a capacitor 69. Envelope detector 51 comprises a transistor 71, resistors 73, 75, 77, and capacitors 79, 81.

Tuned circuit 47 inductively detects current in the respective device 9. Voltage waveform (i) in FIG. 6, referred to previously, represents the train of voltage pulses applied to pin connection 15 (see FIG. 1). Voltage waveform (ii) represents the signal provided by circuit 47 as it detects current flow in device 9 between ground pin 13 and pin 15 via diode 17. It is to be noted from waveform (ii) that on the voltage applied to pin 15 being switched to 5 V the voltage provided by circuit 47 drops whereas on the voltage applied being switched to 0 V the voltage provided rises. The signal provided by circuit 47 passes to amplifier 49 and enters the base of transistor 61 biased by resistors 63, 65. Capacitor 69 provides an AC ground reference for the signal from detector circuit 47. Resistor 67 provides a collector load for transistor 61. Voltage waveform (iii) represents the amplified inverted output signal of amplifier 49.

The signal provided by amplifier 49 passes to envelope detector 51 where it is AC coupled to transistor 71 via capacitor 79. Transistor 71 is biased via resistors 73, 75. The DC base voltage on transistor 71 can be varied by changing the potential of a bias voltage applied at input 83. On the positive going slopes of the signal provided by amplifier 49 (waveform (iii)) capacitor 81 charges quickly while on the negative going slopes capacitor 81 decays slowly through resistor 77. With the passage of time the charge on capacitor 81 increases exponentially. Voltage waveform (iv) represents the change in the output voltage $V_{out}$ of envelope detector 51 with time.

A predetermined test time is set which starts with the beginning of the application of the train of voltage pulses to pin under test 15. On expiry of this time ATE system 1 samples voltage $V_{out}$. If the sampled voltage is above a threshold voltage set by system 1 pin connection 15 is good otherwise it is not.

The bias voltage applied at 83 (the probe bias) is set so that background noise, especially that from the circuit tracks on the board, is ignored. The worst case for the current sensing is where a device adjacent and connected to the device being tested draws all of the applied current when the device being tested is open circuit. So that the test is reliable, the probe bias is set so that current in the adjacent device is ignored but current in the device being tested is detected. In practice, of course, an adjacent connected device can never draw all of the applied current due to its internal diode voltage reducing the current in the node of application connecting the two devices.

It is to be appreciated that the equipment described by way of example need not include frame structure 43 and plurality of probes 5, but need include only a single probe to be manually, or by means of a computer controlled positioning system, positioned over the device being tested under the instruction of ATE system 1.

Figure 7:
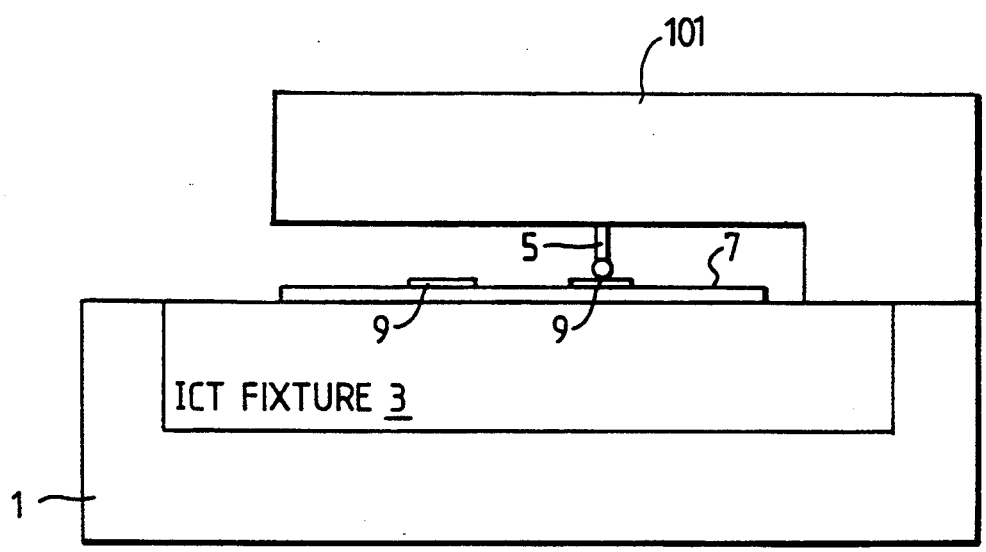
FIG. 7 shows schematically an alternative form of the equipment wherein a computer controlled positioning system together with a single probe replaces the frame structure and probes of FIG. 4.

In FIG. 7 single probe 5 may be positioned over any device 9 by means of computer controlled positioning system 101 under the instruction of ATE system 1, i.e., system 101 is able to move probe 5 to the left, to the right, into and out of the paper to position probe 5 over any device 9 on circuit board 7.

It is also to be appreciated that the coupling of the current sensing probe to the device under test need not be inductive. An alternative indirect form of coupling is capacitive.

It is further to be appreciated that the present invention applies generally to the testing of the pin connections of integrated circuit devices, both digital and analogue. All that is required is that the device include a current path between the pin connection to be tested and another pin connection of the device. This other pin connection need not be a supply pin connection as in the case described by way of example. An example of another type of device that may be tested is a TTL device. TTL devices have the lower clamp diode as shown in FIG. 1 in their circuitry but not necessarily the upper clamp diode. The same current path as used in the CMOS device of FIG. 1 may therefore be used in TTL devices.

It is also further to be appreciated that the invention finds particular application in testing surface mount devices. This is because open circuit connections of such devices are difficult if not impossible to detect with the naked eye. A further reason is that open circuit connections are con,non with such devices. The invention also, of course, applies to devices with standard leads, i.e. leads which pass through the circuit board and are soldered on the underside thereof.

We claim:

1. A method of testing the electrical conductivity of a first connection between an integrated circuit device and a circuit board to which the device is connected, a second connection also connecting said device to said board, said device including therewithin a current path between said first and second connections, said method comprising the steps of, while the circuit is inoperative: applying via said board a first voltage to said second connection; applying via said board a second different voltage to said first connection; and, having applied said first and second voltages, utilizing probe means positioned adjacent said device to sense indirectly current in said current path within the device, the presence of current indicating that said first connection is conductive.

2. A method according to claim 1 wherein said second connection is a supply connection to said device and said current path is in a voltage protection network of said device for protecting said first connection.

3. A method according to claim 2 wherein said protection network includes a diode connected between said supply connection and said first connection, said current path being via said diode.

4. A method according to claim 1 wherein said device is a digital device.

5. A method according to claim 1 wherein said device is a CMOS or TTL device.

6. A method according to claim 1 wherein the voltage applied to said first connection is periodically switched between said first and second voltages, said probe means thereby picking-up an oscillating current signal.

7. A method according to claim 6 wherein said probe means has an inductive pick-up.

8. A method according to claim 7 wherein said probe means comprises: a tuned circuit comprising an inductor connected in parallel with a capacitor connected in parallel with a resistor, said inductor providing said inductive pick-up of the probe means; an amplifier for amplifying the signal provided by the tuned circuit; and an envelope detector for receiving the amplified signal and providing an output voltage, the value of which after a predetermined time indicates whether said first connection is conductive.

9. A method according to claim 1 wherein said second voltage applied to said first connection is applied through a resistor connected to the first connection, said resistor serving to limit current flow.

10. A method according to claim 1 wherein: the voltages applied to said first and second connections are generated by a central control system of an automatic test equipment; and the voltages are applied by means of an in-circuit test fixture of the test equipment, which fixture supports said circuit board and comprises a plurality of nails which contact circuit nodes on said board.

11. A method according to claim 9 wherein said second voltage applied to said first connection is applied by way of a resistor connected between two further nails of said fixture which do not contact circuit nodes on said board, the resistor serving to limit current flow.

12. A method according to claim 9 wherein the automatic test equipment further comprises a frame structure fixed relative to said fixture which holds said probe means in position adjacent said device.

13. A method according to claim 1 wherein said probe means is positioned adjacent said device manually.

14. A method according to claim 1 wherein said probe means is positioned adjacent said device by means of a computer controlled positioning system.

* * * * *